United States Patent
Kinyua

(10) Patent No.: US 8,031,096 B2
(45) Date of Patent: Oct. 4, 2011

(54) HIGH RESOLUTION DELTA-SIGMA DIGITAL-TO-ANALOG CONVERTER

(75) Inventor: Martin Kinyua, Austin, TX (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 12/707,819

(22) Filed: Feb. 18, 2010

(65) Prior Publication Data

US 2011/0199246 A1  Aug. 18, 2011

(51) Int. Cl.
*H03M 3/00* (2006.01)

(52) U.S. Cl. ......................................... 341/143; 341/144

(58) Field of Classification Search .................. 341/143, 341/144
See application file for complete search history.

(56) References Cited

U.S. PATENT DOCUMENTS

| | | | | |
|---|---|---|---|---|
| 5,369,403 | A * | 11/1994 | Temes et al. ................... | 341/143 |
| 5,621,407 | A * | 4/1997 | Jeong et al. .................... | 341/143 |
| 5,870,048 | A * | 2/1999 | Kuo et al. ....................... | 341/143 |
| 6,340,940 | B1 * | 1/2002 | Melanson ....................... | 341/143 |
| 6,369,731 | B1 * | 4/2002 | Takeda et al. .................. | 341/143 |
| 6,369,741 | B1 * | 4/2002 | Demicheli et al. ............. | 341/155 |
| 6,538,589 | B2 * | 3/2003 | Okuda et al. ................... | 341/143 |
| 6,639,531 | B1 * | 10/2003 | Melanson ....................... | 341/143 |
| 6,861,968 | B2 * | 3/2005 | Melanson et al. ............. | 341/143 |
| 6,980,144 | B1 | 12/2005 | Maloberti et al. | |
| 7,009,540 | B1 * | 3/2006 | Chen et al. ...................... | 341/143 |
| 7,345,606 | B2 * | 3/2008 | Reefman et al. ............... | 341/143 |
| 7,532,141 | B2 * | 5/2009 | Kitahira et al. ................ | 341/152 |
| 7,710,300 | B2 * | 5/2010 | Kwan ............................. | 341/143 |
| 2002/0196169 | A1 * | 12/2002 | Okuda et al. ................... | 341/143 |
| 2008/0079619 | A1 * | 4/2008 | Sakurai et al. ................. | 341/144 |
| 2008/0180293 | A1 * | 7/2008 | Kitahira et al. ................ | 341/144 |
| 2009/0251346 | A1 * | 10/2009 | Kwan ............................. | 341/143 |
| 2011/0018753 | A1 * | 1/2011 | Lou et al. ....................... | 341/144 |

OTHER PUBLICATIONS

Xu, Xiaofeng, et al., "The Implementation of Dual-Truncation D/A Converters", Department of Electrical and Computer Engineering, Oregon State University, 1992, IEEE, pp. 597-600.

* cited by examiner

*Primary Examiner* — Linh Nguyen

(74) *Attorney, Agent, or Firm* — Lowe Hauptman Ham & Berner, LLP

(57) ABSTRACT

A circuit for a delta-sigma digital-to-analog converter (DAC) includes a first stage with a delta-sigma noise-shaping loop. The first stage is capable of receiving an input signal, includes a first quantizer that has a first quantization error, and provides a first stage output. A first DAC receives the first stage output and provides a first analog output. A second stage receives the first quantization error. The second stage provides a second stage output to the digital differentiator. A second DAC receives a digital differentiator output and provides a second analog output. An adder adds the first analog output and the second analog output to provide a third analog output, so that the first quantization error is cancelled out and the inband noise is suppressed in the third analog output.

20 Claims, 5 Drawing Sheets

| DAC Resolution (M1+M4) bits | (A) Proposed method | (B) Conventional method using a single-stage design |
|---|---|---|
| # of DAC components | $2^{M1} + 2^{M4}$ | $2^{(M1+M4)}$ |
| e.g. M1=M4= 3 bits | 16 | 64 |

*Fig. 3*

HIGH RESOLUTION DELTA-SIGMA DIGITAL-TO-ANALOG CONVERTER

TECHNICAL FIELD

The present disclosure relates generally to signal processing, and more particularly to a delta-sigma digital-to-analog converter.

BACKGROUND

A digital-to-analog converter (DAC) is a device for converting a digital signal to an analog signal. A delta-sigma modulation used in DAC applications is a method for encoding high-resolution signals into lower resolution signals using pulse-density modulation. Integrated circuits which implements this technique can relatively easily achieve very high resolutions while using low-cost CMOS processes, such as the processes used to produce digital integrated circuits.

However, a conventional delta-sigma DAC using single-stage noise-shaping loop modulators requires high over-sampling ratios (OSR) to achieve a high resolution, thus consumes more power. (Over-sampling is used to reduce the noise in the frequency band of interest.) Also, single stage modulators encounter difficulty in attempting to use a high-resolution truncation DAC due to high number of conversion elements and dynamic element matching (DEM) hardware required. (DEM is a technique used in integrated circuits design to compensate for components mismatch.) Further, single-stage higher-order modulators are prone to suffer from instability, requires complex single-stage topologies, and consume large area in integrated circuits for multi-bit quantization.

On the other hand, a conventional delta-sigma DAC using cascaded modulators can consume large area in integrated circuits. For example, an exemplary DAC using a correction path requires analog differentiators for noise cancellation, and implementation of differentiators in analog domain is a complex and power-consuming task.

Accordingly, new methods for a delta-sigma DAC are desired.

SUMMARY

In one embodiment, a delta-sigma digital-to-analog converter (DAC) includes a first stage with a delta-sigma noise-shaping loop. The first stage is capable of receiving an input signal, includes a first quantizer that has a first quantization error, and provides a first stage output. A first DAC receives the first stage output and provides a first analog output. A second stage receives the first quantization error. The second stage provides a second stage output to the digital differentiator. A second DAC receives a digital differentiator output and provides a second analog output. An adder adds the first analog output and the second analog output to provide a third analog output, so that the first quantization error is cancelled out and the inband noise is suppressed in the third analog output.

In another embodiment, a method for a delta-sigma digital-to-analog converter (DAC) includes receiving an input signal by a first stage including a delta-sigma noise-shaping loop. The first stage has a first quantizer and the first quantizer has a first quantization error. An inband noise is reduced using the first stage to provide a first stage output. The first stage output is provided to a first DAC. The first DAC provides a first analog output. The first quantization error is coupled to a second stage. The second stage provides a second stage output to a digital differentiator. The second stage output is filtered using the digital differentiator. The digital differentiator provides a digital differentiator output. The digital differentiator output is provided to a second DAC. The second DAC provides a second analog output. An adder adds the first analog output and the second analog output to provide a third analog output. The first quantization error is cancelled out and the noise is suppressed in the third analog output.

These and other embodiments of the present invention, as well as its features are described in more detail in conjunction with the text below and attached figures.

BRIEF DESCRIPTION OF THE DRAWINGS

For a more complete understanding of the present invention, and the advantages thereof, reference is now made to the following descriptions taken in conjunction with the accompanying drawings, in which:

FIG. 3 illustrates a table comparing the number of components used for a conventional DAC and the exemplary DAC shown in FIG. 2;

DETAILED DESCRIPTION

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the invention.

Figure 1:
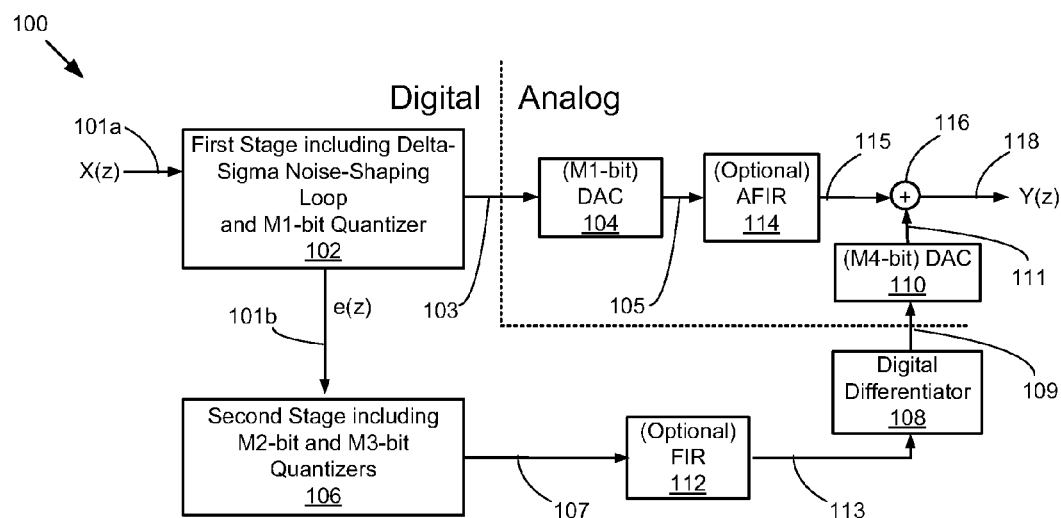
FIG. 1 illustrates an exemplary schematic diagram of a delta-sigma DAC.

FIG. 1 illustrates an exemplary schematic diagram of a delta-sigma digital-to-analog converter (DAC). The delta-sigma DAC 100 receives a digital input signal X(z) 101a and converts it to an analog output signal Y(z) 118. The delta-sigma DAC 100 includes cascaded stages, i.e., a first stage 102 and a second stage 106. The first stage 102, including a delta-sigma ($\Delta\Sigma$; or sigma-delta, $\Sigma\Delta$) noise-shaping loop, receives the input signal X(z) and produce a first stage output 103 (M1-bit) by suppressing inband noise (i.e., noise in the frequency band of interest). The delta-sigma noise-shaping loop is known in the art and can be implemented in many ways. Also, the first stage 102 includes a first quantizer (not shown in FIG. 1, 202 in FIG. 2) that has a first quantization error 101b.

After the input signal X(z) 101a passes through the first stage 102 including the delta-sigma noise-shaping loop, the first stage output 103 is sent to the first DAC 104. The first DAC 104 converts the first stage output 103 to an analog signal to provide a first analog output 105. An optional analog finite impulse response (AFIR) filter 114 can be used on the first analog output 105 to provide further filtering before it is sent to the adder 116.

The first quantization error 101b, i.e., e(z), is coupled to the second stage 106. The second stage 106 then provides further noise-shaping of the first quantization error 101b by re-quantizing the first quantization error 101b to provide a second stage output 107 by a second (M2-bit) and a third (M3-bit)

quantizers (208 and 212 in FIG. 2) with inter-stage gain scaling, filtering, and feedback, as described below under FIG. 2. The second stage output 107 may be passed through further filtering, e.g., an optional finite impulse response (FIR) filter 112, and then coupled to the digital differentiator 108. The digital differentiator 108 provides differentiator function to its input and provides a digital differentiator output 109. A second DAC 110 (M4-bit) converts the digital differentiator output 109 to a second analog output 111.

Compared to a conventional DAC using complicated analog differentiators, using digital differentiator 108 reduces analog computation in exchange for increased digital computation. Regarding the relationship among M1, M2, M3, and M4 bits, the following relationship can be provided: M1≦M2≦M3≦M4. The first analog output 105 (or 115 if the optional AFIR 114 is used) and the second analog output 111 are combined by an adder 116 to provide a third analog output 118, i.e., Y(z).

The function of the delta-sigma DAC 100 is to minimize error by having the relatively large first quantization error e(z) of the first stage 102 cancelled out. As explained below under FIG. 2, a second quantization error (i.e., $e_2(z)$ shown in FIG. 2) from the second quantizer (M2-bit) in the second stage 106 also cancels out, while only a relatively small third quantization error (i.e., $e_3(z)$ shown in FIG. 2) of the third quantizer (M3-bit) remains. Further, the spectrum of $e_3(z)$ is shaped, i.e., high-pass filtered by the digital differentiator 108 and analog filter 216, and its inband noise is suppressed.

Figure 2:
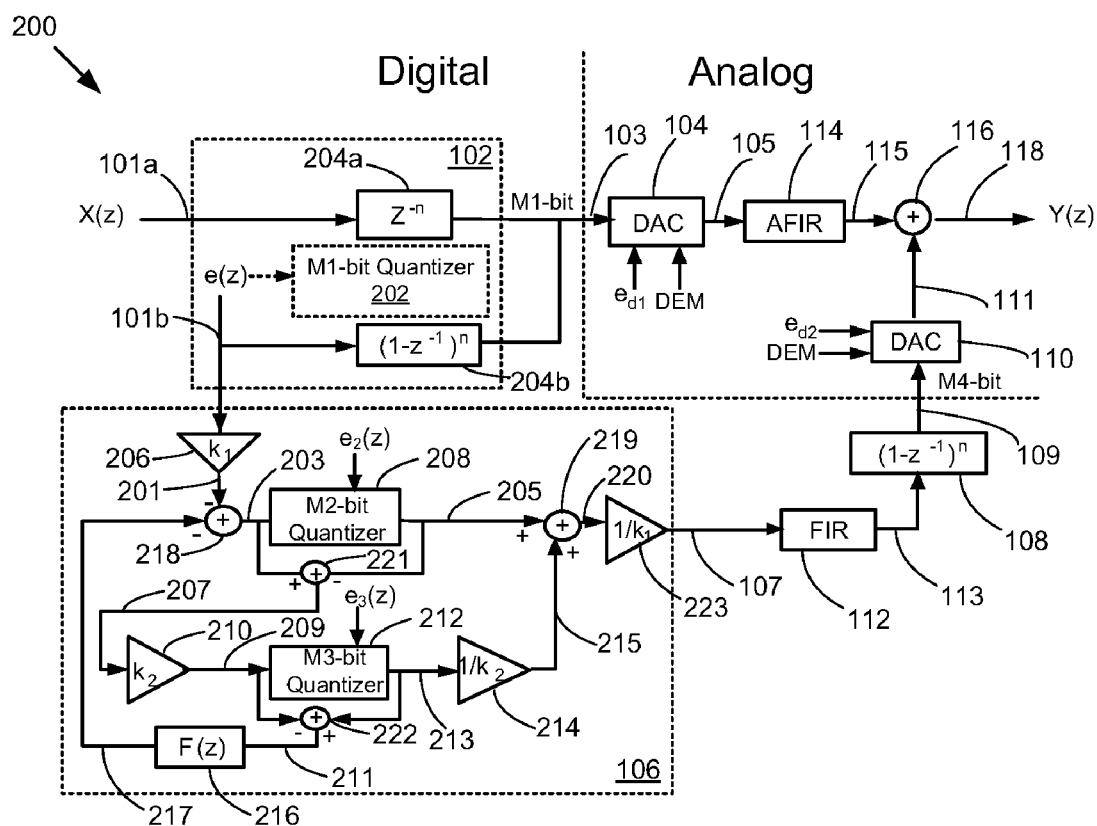
FIG. 2 illustrates an exemplary embodiment of the delta-sigma DAC shown in FIG. 1.

FIG. 2 illustrates an exemplary embodiment of the delta-sigma DAC shown in FIG. 1. The first stage 102 is shown to include the first (M1-bit) quantizer 202. Because the delta-sigma noise-shaping loop in the first stage 102 is known in the art and there are various ways to implement it, the first stage 102 is represented in terms of the transfer functions 204a and 204b, instead of specific implementations. The first stage 102 has an effective transfer function 204a on the input signal X(z) that shows an n-th order delays, and 204b on the first quantization error e(z) that shows an n-th order differentiation, where n is a positive number.

The first DAC 104 converts the first stage output 103 to an analog signal to provide a first analog output 105. The first DAC 104 may have a non-linearity error $e_{d1}$ when M1 is a more than 1-bit, and also have DEM to compensate for the said non-linearity error. In another example, when M1 is 1-bit, the first DAC 104 does not have DEM, because a single-bit DAC is inherently linear and do not require DEM techniques.

The second stage 106 includes an inter-stage gain $k_1$ at 206, where $k_1$ is a number greater than or equal to 1. The first quantization error 101b is scaled by applying an inter-stage gain $k_1$. In one example, $k_1$ is $2^{M1}$. The scaled error 201 (with a minus sign) is added with a feedback signal 217 (with a minus sign) at the adder 218. The second quantizer 208 (M2-bit) quantizes the added signal 203. The second quantizer output signal 205 is added at an adder 219. The second quantizer 208 has the second quantization error $e_2(z)$. $e_2(z)$ is extracted by subtracting the second quantizer input 203 from the second quantizer output 205 at an adder 221 and scaled by an inter-stage gain $k_2$ at 210, where $k_2$ is a number greater than or equal to 1. In one example, $k_2$ is $2^{M2}$. The error signal 209 after scaling with $k_2$ is quantized by the third quantizer 212 (M3-bit), further scaled by an inter-stage gain $1/k_2$ at 214, and then added at the adder 219. The delta-sigma DAC 200 is area-efficient compared to flash type quantizers (i.e., simultaneous/parallel type) because of pipelined quantizers, e.g., the second quantizer 208 and the third quantizer 212.

The third quantization error $e_3(z)$ 211 is extracted by subtracting the third quantizer input 209 from the third quantizer output 213 at an adder 222 and passes through a digital filter F(z) 216 for further filtering. The filtered signal 217 is provided to the adder 218 as a feedback signal 217. The second quantizer output signal 205 and the signal 215 after the $1/k_2$ inter-stage gain 214 are added at the adder 219 to provide the added signal 220. The added signal 220 is scaled by an inter-stage gain $1/k_1$ to provide the second stage output 107. The digital differentiator 108 is represented by its transfer function in FIG. 2, showing an n-th order differentiation. Due to its digital implementation, it avoids the complexity of implementing analog differentiators in integrated circuits. The second DAC 110 (M4-bit) may have DEM to compensate for component mismatch from non-linear error $e_{d2}$.

The transfer function of the delta-sigma DAC 200 can be expressed by Equation (1) below.

$$Y(z) = X(z) \cdot z^{-n} + \frac{e_3(z)}{k_1 k_2}(1 - F(z) \cdot k_2)(1 - z^{-1})^{-n} \qquad \text{Equation (1)}$$

Equation (1) shows that the relatively large first quantization error e(z) of the first stage 102 is canceled out as well as the second quantization error $e_2(z)$ of the second quantizer 208 in the second stage 106. Only the relatively small third quantization error $e_3(z)$ remains in the transfer function. The second term in Equation (1) provides a noise-shaping function, which is an n-th order noise-shaping of $e_3(z)$, scaled by $k_1$ and $k_2$, the inter-stage gains. The spectrum of $e_3(z)$ is shaped, i.e., high pass filtered by the digital differentiator 108 and also scaled by the factor $k_1 k_2$, which has the effect of suppressing its inband power. Therefore, the noise-shaping function is enhanced by scaling the final quantization error $e_3(z)$ by the inter-stage gains. The inter-stage gains substantially improve the overall resolution and they are implemented in the digital domain, thus do not require complicated analog amplifiers.

For example, when n=2 and $F(z)=z^{-1}/k_2$, then $1-F(z)\cdot k_2=1-z^{-1}$, and the transfer function from Equation (1) becomes:

$$Y(z) = X(z) \cdot z^{-2} + \frac{e_3(z)}{k_1 k_2}(1 - z^{-1})^{-3} \qquad \text{Equation (2)}$$

In Equation (2), the second term provides a noise-shaping function, which is a third order noise-shaping of $e_3(z)$, scaled by $k_1$ and $k_2$ (i.e., the inter-stage gains). The effect is enhanced noise-shaping function that suppressed inband noise. Even though a specific example of the digital filter F(z) 216 is given in this example, different embodiments can use different digital filters to provide a desired transfer function from Equation (1). A skilled person in the art will appreciate that there can be many embodiment variations.

FIG. 3 illustrates a table comparing the number of components used for a conventional DAC and the exemplary DAC 200 shown in FIG. 2. The resolution of the exemplary DAC 200 is (M1+M4) bits. In general, the number of required DAC components for a conventional DAC using a single-stage design with (M1+M4) bit resolution can be $2^{(M1+M4)}$ according to one embodiment. In comparison, the number of DAC components for the exemplary DAC 200 shown in FIG. 2 is $(2^{M1}+2^{M4})$.

For example, for the exemplary DAC 200 with M1=M4=3 bits, the effective resolution is (M1+M4)=6 bits. For a conventional DAC using a single-stage design with a resolution of 6 bits, the number of DAC components required is $2^6=64$, according to one embodiment. In comparison, the number of DAC components required for the exemplary DAC 200 is $2^3+2^3=16$. Therefore, for a 6-bit DAC implementation, the exemplary DAC 200 can have 4 times less DAC components than the conventional DAC. Therefore, embodiments of the delta-sigma DAC shown in FIG. 1 and FIG. 2 can have a relatively high-resolution at lower component count and lower power consumption when compared to a conventional DAC.

Further, the effective quantization noise suppression of the exemplary DAC 200 corresponds to a single stage DAC with $M4*k_1*k_2$ levels, while employing less DAC unit components. Reduced DAC component count means reduced area in integrated circuits.

Figure 4:
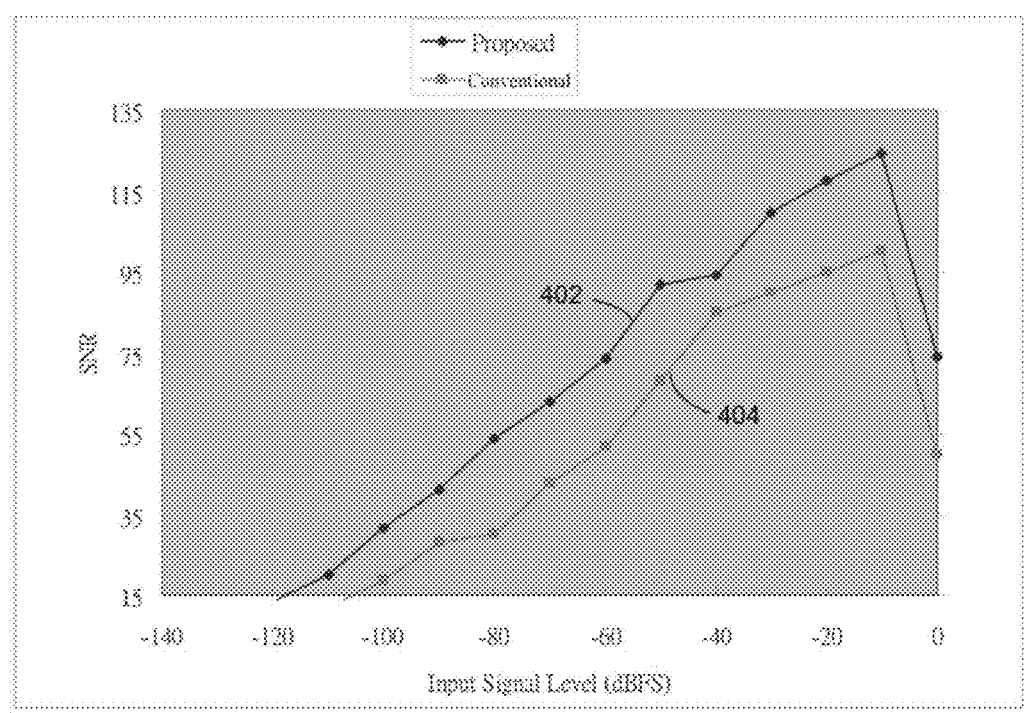
FIG. 4 illustrates a signal-to-noise ratio (SNR) plot comparing a conventional DAC and the exemplary DAC shown in FIG. 2.

FIG. 4 illustrates a signal-to-noise ratio (SNR) plot comparing a conventional DAC and the exemplary DAC 200 shown in FIG. 2. FIG. 4 assumes a third-order noise shaper with an equivalent component count for the conventional DAC and the exemplary DAC 200. The SNR 402 of the exemplary DAC 200 shows a consistently better SNR over various input signal levels when compared to the SNR 404 of a conventional DAC.

Figure 5:
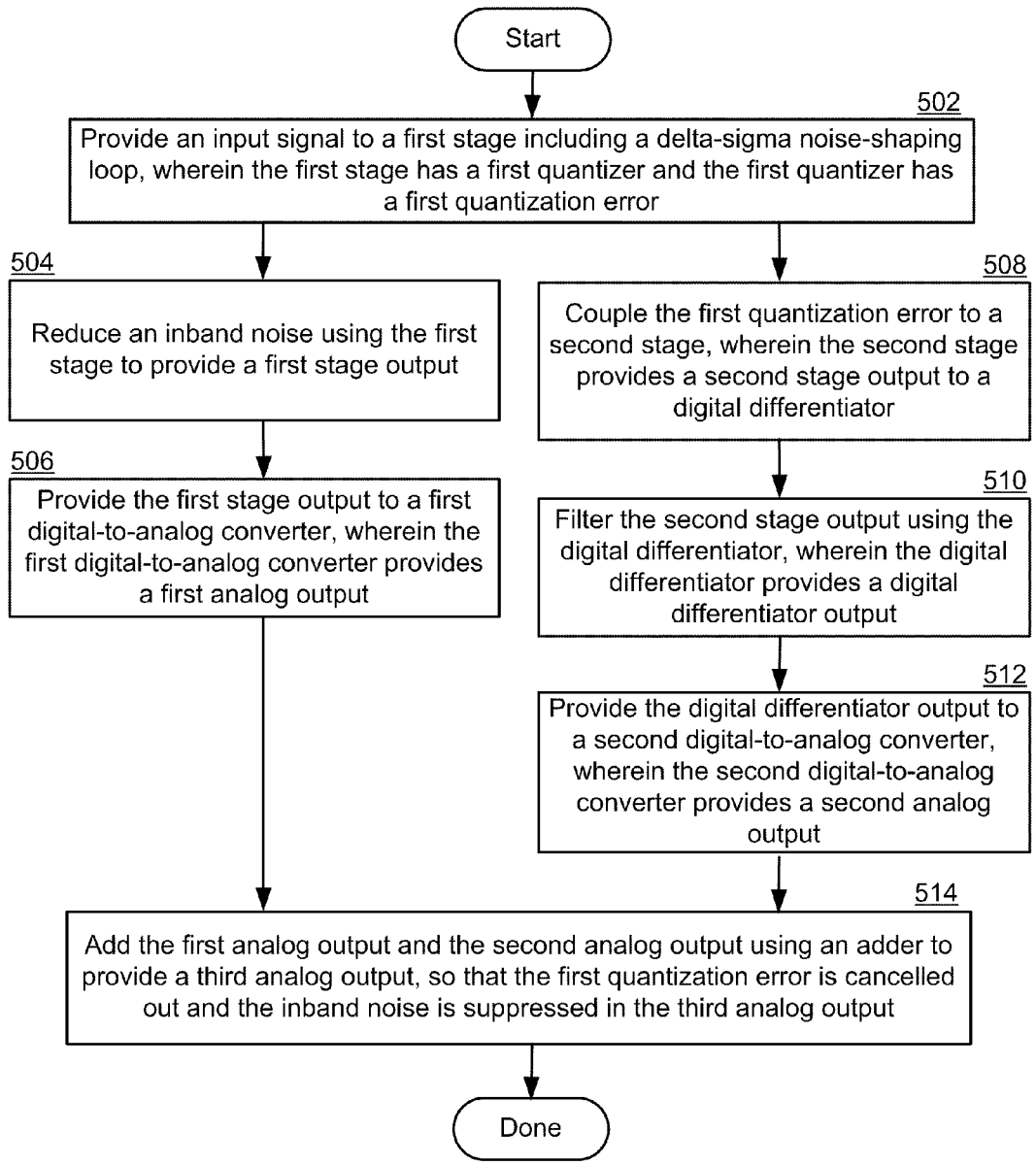
FIG. 5 illustrates an exemplary method for a delta-sigma DAC shown in FIG. 1.

FIG. 5 illustrates an exemplary method for a delta-sigma DAC shown in FIG. 1. At step 502, an input signal $X(z)$ 101$a$ is provided to the first stage 102 including a delta-sigma noise-shaping loop. The first stage 102 has a first quantizer 202 and the first quantizer 202 has a first quantization error 101$b$, i.e., $e(z)$. At step 504, an inband noise is reduced using the first stage 102 to provide a first stage output 103. At step 506, the first stage output 103 is provided to the first DAC 104 (M1-bit). The first DAC 104 provides a first analog output 105. At step 508, the first quantization error 101$b$ is coupled to a second stage 106. The second stage 106 provides a second stage output 107 to a digital differentiator 108. At step 510, the second stage output 107 is filtered using the digital differentiator 108. The digital differentiator 108 provides a digital differentiator output 109. At step 512, the digital differentiator output 109 is provided to a second DAC 110 (M4-bit). The second DAC 110 provides a second analog output 111. At step 514, an adder 116 adds the first analog output 105 and the second analog output 111 to provide a third analog output 118, i.e., $Y(z)$. The first quantization error 101$b$ is cancelled out and the inband noise is suppressed in the third analog output 118.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

The above method embodiment shows exemplary steps, but they are not necessarily required to be performed in the order shown. Steps may be added, replaced, changed order, and/or eliminated as appropriate, in accordance with the spirit and scope of embodiment of the invention.

Each claim of this document constitutes a separate embodiment, and embodiments that combine different claims and/or different embodiments are within scope of the invention and will be apparent to those skilled in the art after reviewing this disclosure. Accordingly, the scope of the invention should be determined with reference to the following claims, along with the full scope of equivalences to which such claims are entitled.

What is claimed is:

1. A delta-sigma digital-to-analog converter (DAC), comprising:
   a first stage including a delta-sigma noise-shaping loop, wherein the first stage is capable of receiving an input signal, the first stage has a first quantizer, the first quantizer has a first quantization error, the delta-sigma noise-shaping loop is configured to suppress an inband noise, and the first stage provides a first stage output;
   a first DAC, wherein the first DAC receives the first stage output and provides a first analog output;
   a digital differentiator that provides a digital differentiator output;
   a second DAC, wherein the second DAC receives the digital differentiator output and provides a second analog output;
   an adder that adds the first analog output and the second analog output to provide a third analog output; and
   a second stage that receives the first quantization error, wherein the second stage is configured to provide a second stage output to the digital differentiator so that the first quantization error is cancelled out and the inband noise is suppressed in the third analog output.

2. The circuit of claim 1, wherein the second stage has an inter-stage gain $k_1$ applied to the first quantization error and the second stage has an inter-stage gain $1/k_1$ applied to the second stage output, and $k_1$ is a number greater than or equal to 1.

3. The circuit of claim 1, wherein the second stage has a second quantizer and a third quantizer, the second quantizer has a second quantization error, and the second stage is configured to cancel out the second quantization error.

4. The circuit of claim 3, wherein an inter-stage gain $k_2$ is applied to the second quantization error, which is then received by the third quantizer, the third quantizer provides a third quantizer output, an inter-stage gain $1/k_2$ is applied to the third quantizer output, which is then added with the second quantizer output in order to provide the second stage output, and $k_2$ is a number greater than or equal to 1.

5. The circuit of claim 4, wherein the third quantizer has a third quantization error, the third quantization error goes through a digital filter, which is then fed back to the second quantizer.

6. The circuit of claim 1, further comprising a finite impulse response filter that provides filtering of the second stage output.

7. The circuit of claim 1, further comprising an analog finite impulse response filter that provides filtering of the first analog output.

8. The circuit of claim 1, wherein a dynamic element matching is used in the first DAC.

9. The circuit of claim 1, wherein a dynamic element matching is used in the second DAC.

10. A method for a delta-sigma digital-to-analog converter (DAC), comprising:
   providing an input signal to a first stage including a delta-sigma noise-shaping loop, wherein the first stage has a first quantizer and the first quantizer has a first quantization error;
   reducing an inband noise using the first stage to provide a first stage output;
   providing the first stage output to a first DAC, wherein the first DAC provides a first analog output;
   coupling the first quantization error to a second stage, wherein the second stage provides a second stage output to a digital differentiator;
   filtering the second stage output using the digital differentiator, wherein the digital differentiator provides a digital differentiator output;
   providing the digital differentiator output to a second DAC, wherein the second DAC provides a second analog output; and
   adding the first analog output and the second analog output using an adder to provide a third analog output, so that the first quantization error is cancelled out and the inband noise is suppressed in the third analog output.

11. The method of claim 10, further comprising:
   applying an inter-stage gain $k_1$ to the first quantization error received by the second stage, wherein $k_1$ is a number greater than or equal to 1; and
   applying an inter-stage gain $1/k_1$ to the second stage output.

12. The method of claim 10, further comprising quantizing the first quantization error received by the second stage using a second quantizer to provide a second quantizer output, wherein the second quantizer has a second quantization error.

13. The method of claim 12, further comprising;
   applying an inter-stage gain $k_2$ to the second quantization error to provide a scaled second quantization error, wherein $k_2$ is a number greater than or equal to 1;
   quantizing the scaled second quantization error using a third quantizer to provide a third quantizer output, wherein the third quantizer has a third quantization error;
   applying an inter-stage gain $1/k_2$ to the third quantization output to provide scaled third quantizer output; and
   adding the scaled third quantizer output to the second quantizer output to provide the second stage output.

14. The method of claim 13, further comprising;
   filtering the third quantization error to provide a filtered third quantization error; and
   feeding back the filtered third quantization error to the second quantizer.

15. The method of claim 10, further comprising applying a finite impulse response filter to the second stage output.

16. The method of claim 10, further comprising applying an analog finite impulse response filter to the first analog output.

17. The method of claim 10, wherein a dynamic element matching is used in the first DAC.

18. The method of claim 10, wherein a dynamic element matching is used in the second DAC.

19. A method for a delta-sigma digital-to-analog converter (DAC), comprising:
   providing an input signal to a first stage including a delta-sigma noise-shaping loop, wherein the first stage has a first quantizer and the first quantizer has a first quantization error;
   reducing an inband noise using the first stage to provide a first stage output;
   providing the first stage output to a first DAC, wherein the first DAC provides a first analog output;
   providing the first quantization error to a second stage, wherein the second stage provides a second stage output to a digital differentiator;
   applying an inter-stage gain $k_1$ to the first quantization error received by the second stage to provide a scaled first quantization error, wherein $k_1$ is a number greater than or equal to 1;
   quantizing the scaled first quantization error using a second quantizer to provide a second quantizer output, wherein the second quantizer has a second quantization error;
   applying an inter-stage gain $1/k_1$ to the second stage output and then filtering the second stage output using the digital differentiator, wherein the digital differentiator provides a digital differentiator output;
   providing the digital differentiator output to a second DAC, wherein the second DAC provides a second analog output; and
   adding the first analog output and the second analog output using an adder to provide a third analog output, so that the first quantization error is cancelled out and the inband noise is suppressed in the third analog output.

20. The method of claim 19, further comprising;
   applying an inter-stage gain $k_2$ to the second quantization error to provide a scaled second quantization error, wherein k2 is a number greater than or equal to 1;
   quantizing the scaled second quantization error using a third quantizer to provide a third quantizer output, wherein the third quantizer has a third quantization error;
   applying an inter-stage gain 1/k2 to the third quantization output to provide scaled third quantizer output;
   adding the scaled third quantizer output to the second quantizer output to provide the second stage output;
   filtering the third quantization error to provide a filtered third quantization error; and
   feeding back the filtered third quantization error to the second quantizer.

* * * * *